United States Patent [19]
Kobayashi

[11] Patent Number: 5,650,015
[45] Date of Patent: Jul. 22, 1997

[54] DRY METHOD FOR CLEANING SEMICONDUCTOR SUBSTRATE

[75] Inventor: Ichizo Kobayashi, Tsukuba, Japan

[73] Assignee: Nippon Sanso Corporation, Tokyo, Japan

[21] Appl. No.: 504,993

[22] Filed: Jul. 20, 1995

[30] Foreign Application Priority Data

Aug. 11, 1994 [JP] Japan .................................. 6-189675

[51] Int. Cl.$^6$ .................................................. B08B 7/00
[52] U.S. Cl. ...................................... 134/2; 134/26
[58] Field of Search ........................ 134/2, 1.3, 26; 156/646

[56] References Cited

U.S. PATENT DOCUMENTS

| | | | |
|---|---|---|---|
| 3,837,905 | 9/1974 | Hile et al. | 437/186 |
| 5,094,701 | 3/1992 | Norman et al. | 148/23 |
| 5,332,444 | 7/1994 | George et al. | 134/1 |
| 5,368,687 | 11/1994 | Sandhu et al. | 156/664 |

FOREIGN PATENT DOCUMENTS 6-104227  4/1994  Japan .

OTHER PUBLICATIONS

Patent Abstracts of Japan vol. 18, No. 372 (E–1577) (6712) Jul. 13, 1994.

Kern and Puotinen, "Cleaning Solutions Based on Hydrogen Peroxide for use in Silicon Semiconductor Technology", RCA Review, vol. 31, No. 2, Jun. 1970, pp. 187–205.

Ito and Sugino, Semiconductor World, vol. 3, 1989, pp. 120–123.

Primary Examiner—Jill Warden
Assistant Examiner—Alexander Markoff
Attorney, Agent, or Firm—Dilworth & Barrese

[57] ABSTRACT

A method is presented for cleaning of metallic surface contaminants from the surfaces of semiconductor substrate in semiconductor device manufacturing. The method is a dry method and avoids many of the problems introduced by the conventional wet method of cleaning while achieving a level of cleanliness better than the wet method. The method involves halogenizing the contaminants by exposing the wafers to a gas containing a halogen gas to form halogenized compounds of the contaminants. This is followed by a process of exposing the halogenized compounds to a gas containing β-diketone so as to convert the halogenized compounds to β-diketone complexes to enable highly efficient removal of the metallic surface contaminants by vaporization.

14 Claims, No Drawings

DRY METHOD FOR CLEANING SEMICONDUCTOR SUBSTRATE

BACKGROUND OF THE INVENTION

1. Field of the Invention

The present invention relates in general to a method for cleaning semiconductor substrates and relates in particular to a dry method of cleaning the substrate.

2. Technical Background

Semiconductor devices are produced after many processing stages, and during such processing, the surfaces of the substrate, for example, silicon wafers, can become contaminated. If the wafer surfaces are contaminated with alkaline metals, or heavy metals such as Fe, Al, Cu, Cr or Ni, the electrical properties of the semiconductor devices made from such contaminated wafers are seriously degraded. Therefore, thorough cleaning of contaminated wafer surfaces constitutes an important process that determines the quality of manufactured semiconductor devices.

One such cleaning method by Kern of RCA (published in RCA Review, volume 31, page 187, 1970) is still in use today. The method, termed the "RCA method", is a wet method and involves the use of aqueous solutions containing ammonia-hydrogen peroxide, hydrofluoric acid, and hydrochloric acid-hydrogen peroxide. The RCA method is effective in reducing the contamination by metallic contaminants to the level of $10^{11} \sim 10^{10}$ atoms/cm$^2$, depending on the type of metallic contaminant.

With increasing density of circuit integration, an even greater degree of cleanliness is demanded by the device making industry. It has been said that the limit of the wet cleaning technology has now been reached, because of the inherent limitations imposed by the purity of water and chemicals used in the wet cleaning technology. Therefore, there has been a need to develop a new type of cleaning technology.

It is possible to replace the wet cleaning of silicon wafers using aqueous solution with a dry method requiring no use of aqueous solutions. One example of the dry cleaning method is based on forming metal chlorides of metallic surface contaminants by chloride radicals generated with the use of ultraviolet irradiation, and removing the metal chlorides by vaporization (refer to Ito and Sugino, Semiconductor World, volume 3, page 120, 1989). However, this technique is inadequate to remove the contaminants to the level required by the semiconductor device making industry. A variation of this technique is to form volatile metal-ligand complex by first oxidizing the metallic contaminants, followed by exposure of the metal oxides to β-diketone so as to remove the resulting complex by vaporization (U.S. Pat. No. 5,094,701).

This technique of dry cleaning based on chloride radicals has received some attention because of its superiority to the wet cleaning method due to the many advantages offered by the dry method, i.e., chemicals and water which are inherently necessary in the wet cleaning method are not needed, the wafers need not be dried and the dry-cleaning chemicals are able to effectively reach the fine crevices on the substrate.

However, the dry cleaning method based on chloride radicals falls short of the desired goal again, because of the inherent problems that the generated chloride radicals do not possess sufficient vapor pressure to permit a complete removal of the contaminants by vaporization, and in that there is a danger of developing excessive etching by the chloride radicals on the fabricated wafers. Furthermore, this technique can only achieve a level of cleanliness of $10^{13}$ atoms/cm$^2$ and has yet to reach the level of cleanliness achievable by the conventional wet cleaning method ($10^{10}$ atoms/cm$^2$).

SUMMARY OF THE INVENTION

The purpose of the present invention is to present a method, based on the merits of the dry approach, for cleaning surface metallic contaminants from the semiconductor substrate so as to achieve a level of cleanliness, better than that possible by the conventional wet method of cleaning, which has not yet been attained by the conventional dry method.

This invention relates to a method for dry cleaning semiconductor substrates comprising the steps of: halogenizing the metallic surface contaminants by exposing the surface to a gas containing a gaseous halogen so as to form halogen compounds of the metallic surface contaminants; and exposing the surface having halogenized metallic surface contaminants to a gas containing β-diketone so as to form β-diketone complexes and remove the β-diketone complexes from the surface by vaporization.

The β-diketone to be used in the method is either acetylacetone or dipivaloylmethane.

The halogen gas to be used in the method is gaseous chlorine which is economical and easy to handle.

DETAILED DESCRIPTION OF THE PREFERRED EMBODIMENTS

The present inventors conducted various trial-and-error experiments on the reactivity of β-diketone with alkaline metals such as Na and K and heavy metals such as Fe, Al, Cu, Cr, and Ni, and discovered that by converting these metallic surface contaminants to metal chlorides in-situ and reacting the metal chlorides with β-diketone, complexes of β-diketone can be produced at extremely high efficiency.

It was thus reasoned that by first converting the metallic surface contaminants present on semiconductor surface to chlorides in-situ and reacting the formed metal chlorides with β-diketone, it may be possible to convert the metal chlorides to β-diketone complexes which may then be vaporized. Therefore, experiments were conducted to explore the conditions for chloriding of the metallic contaminants on the surface of semiconductor substrate. The results confirmed that by holding the substrate base at a relatively high temperature, such as 200° C., and exposing the substrate to gaseous chlorine carried in an inert gas, it is possible to form chlorides of the metallic contaminants on the surface of the substrate, i.e. alkaline metals, such as Na and K, and heavy metals such as Fe, Al, Cu, Cr, and Ni. It was further discovered that, in addition to gaseous chlorine, gaseous fluorine and bromine are also effective in producing the same effects.

It has thus led to the fruition of the present invention that under the specified conditions of dry cleaning of the semiconductor substrate, only the surface metallic contaminants can be chlorided in-situ without introducing damage to the semiconductor substrate from the effects of chemical etching and other side reactions.

Therefore, the method of the present invention of dry cleaning of semiconductor substrate comprises the steps of: halogenizing by heating the surface of the substrate to about 200° C. and exposing the heated substrate to a halogen gas to halogenize metallic contaminants; and forming a complex of β-diketone by reacting the halogenized metallic contaminants with β-diketone. In the method of the present invention, the halogenized metallic contaminants convert into volatile β-diketone complexes as those shown by the typical reaction (A) presented below are produced, and the β-diketone complexes thus formed are swept out of the system by the flowing inert carrier gas. A hydrogen halogenide released from the halogenized metallic contaminants is also swept out of the system by the inert carrier gas.

The complex reaction (A) can be expressed as follows:

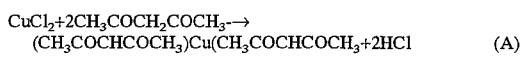

$$CuCl_2 + 2CH_3COCH_2COCH_3 \rightarrow (CH_3COCHCOCH_3)Cu(CH_3COCHCOCH_3) + 2HCl \quad (A)$$

where a metallic contaminant is represented typically by Cu(II), and gaseous halogen by chlorine gas and β-diketone by acetylacetone.

The above reaction holds true for Cu(I) as well as for CuCl. More specifically, the metallic contaminant Cu is chlorided in-situ to become copper chloride which comes into contact with acetylacetone to form a complex of acetylacetone and hydrogen chloride, both of which are vaporized out of the system. The result is that the residual Cu impurity level on the semiconductor substrate is reduced to a range of $10^{10}$ atoms/cm$^2$.

In the above embodiment, there is no particular restriction to the type of β-diketones to be used, but those hydrocarbons having relatively low molecular weight such as acetylacetone ($CH_3COCH_2COCH_3$) or dipivaloylmethane (($CH_3)_3CCOCH_2COC(CH_3)_3$) are preferable.

The range of temperatures for dry cleaning process can be between 150° to 350° C., or preferably about 200° C., for the halogenizing process by exposing the metallic contaminants on the substrate surface with a halogen gas and for the process to form β-diketone complexes by reacting the halogenized metallic contaminants with β-diketone. The holding temperature can be the same in the two processing steps, or can be different. When using other halogen gases, it is preferable that the temperature be about 180° C. for chlorine gas and 230° C. for bromine gas.

Also, there are no particular restrictions on the pressure under which to conduct halogenizing processes by exposing the metallic contaminants on the base surface with a halogen gas and to conduct processes to form β-diketone complexes by reacting the halogenized metallic contaminants with β-diketone. A pressure of about 760 Torr is acceptable.

The mixture of a halogen gas and β-diketone are directed to the surface of the semiconductor substrate by being transported in a carrier gas such as argon or helium gas. To supply liquid β-diketone in the mixture with a carrier gas, it is suitable to bubble the carrier gas through a bottle containing the liquid β-diketone so as to supply the carrier gas containing the vapor of β-diketone to the reaction system.

EXAMPLE 1

Silicon wafers having known concentrations of metallic contaminants (Na, Fe, Al, Cu, Cr, and Ni), as determined by the ICP-MS (Inductively Coupled Plasma Mass Spectrometer) quantitative analytical technique, were placed in a furnace and held at 200° C. to be exposed for 3 minutes to a flow of argon gas containing 5 volume % of chlorine gas ($Cl_2$) at a flow rate of 95 ml/min, which was followed by an exposure for 25 minutes to a flow of argon gas containing 17 volume % of acetylacetone at a flow rate of 120 ml/min. The system pressure was maintained at 450 Torr.

The concentrations of the metallic surface contaminants (Na, Fe, Al Cu, Cr, and Ni) were again determined with the ICP-MS quantitative analytical technique. The results are shown in Table 1.

EXAMPLE 2

Silicon wafers having known concentrations of metallic contaminants (Na, Fe, Al, Cu, Cr, and Ni), as determined by the ICP-MS quantitative analytical technique, were placed in a furnace and held at 200° C. to be exposed for 30 minutes to a flow of argon gas mixture containing 5.5 volume % of chlorine gas ($Cl_2$) and 17.5 volume % of dipivaloylmethane at a flow rate of 500 ml/min. The pressure was kept at 350 Torr.

The state of metallic surface contaminants (Na, Fe, Al, Cu, Cr, and Ni) was again examined with the ICP-MS quantitative analytical technique. The results are also shown in Table 1.

TABLE 1

|  | Na | Fe | Al | Cu | Cr | Ni |
| --- | --- | --- | --- | --- | --- | --- |
| Example 1 | 6.3 (6.5) | 0.3 (8.1) | 4.1 (7.1) | 0.4 (5.5) | 3.4 (7.3) | 2.7 (6.4) |
| Example 2 | 7.1 (6.8) | 0.5 (8.6) | 4.5 (7.8) | 0.8 (6.1) | 5.1 (7.6) | 3.1 (7.1) | where the units are expressed in $10^{10}$ atoms/cm$^2$, and the numerical figures inside the parentheses refer to the quantity before the cleaning processing in $10^{14}$ atoms/cm$^2$.

Table 1 shows that the concentrations of the metallic surface contaminants before applying the cleaning treatment to the semiconductor substrate (refer to the numerical figures inside the brackets for Na, Fe, Al, Cu, Cr, and Ni), were at a level of $10^{14}$ atoms/cm$^2$, and that, after the cleaning processes were applied as described in Examples 1 and 2, the metallic surface contaminants were reduced to a level of $10^{10}$ atoms/cm$^2$.

As explained above, it is clear that the present invention presents a method of reducing the metallic surface contamination on the surface of wafers, contaminated during semiconductor device manufacturing, by halogenizing the metallic surface contaminants so as to promote the formation of volatile β-diketone complexes of the halogenized metallic contaminants, followed by removal of the halogenized metallic compounds by vaporization as β-diketone complexes to attain a level of cleanliness in the range of $10^{10}$ atoms/cm$^2$.

What is claimed is:

1. A method for dry removal of metallic surface contaminants from surfaces of semiconductor substrate, comprising the steps of:

halogenizing said metallic surface contaminants by exposing the surfaces to a gas consisting essentially of a gaseous halogen so as to form halogen compounds of said metallic surface contaminants, whereby only said metallic surface contaminants are halogenized in-situ without damaging said semiconductor substrate due to effects of chemical etching and other side reactions; and exposing the surfaces having halogenized metallic surface contaminants to a gas containing β-diketone so as to form β-diketone complexes incorporating metals of said metallic surface contaminants and remove said β-diketone complexes from the surfaces by vaporization, residual metallic impurity level on said semiconductor substrate after exposure being on the order of $10^{10}$ atoms/cm$^2$, wherein said halogenizing and exposing are performed at temperatures within the range of 150°~350° C.

2. A method as claimed in claim 1, wherein said β-diketone is selected from a group consisting of acetylacetone and dipivaloylmethane.

3. A method as claimed in claim 1, wherein said gaseous halogen is gaseous chlorine.

4. A method as claimed in claim 1, wherein said metallic surface contaminants comprise at least one metal selected from the group consisting of Na, Fe, Al, Cu, Cr and Ni.

5. A method as claimed in claim 4, wherein residual metallic impurity level on the semiconductor substrate after exposure is on the order of $10^{10}$ atoms/cm$^2$.

6. A method as claimed in claim 1, wherein said gaseous halogen is gaseous fluorine or bromine.

7. A method as claimed in claim 1 wherein said halogenizing and exposing are performed at a temperature of about 200° C.

8. A method as claimed in claim 3, wherein said halogenizing and exposing are performed at a temperature of about 180° C.

9. A method as claimed in claim 6, wherein said halogenizing and exposing are performed at a temperature of about 230° C.

10. A method as claimed in claim 1, wherein said halogenizing and exposing are performed at a pressure of about 760 Torr.

11. A method as claimed in claim 1, wherein said gases consisting essentially of said gaseous halogen and containing said β-diketone each include an inert carrier gas.

12. A method as claimed in claim 11, wherein said inert carrier gas is argon or helium.

13. A method as claimed in claim 11, additionally comprising the step of bubbling said inert carrier gas through a bottle containing liquid β-diketone to form said gas containing β-diketone.

14. A method as claimed in claim 1, wherein said gas consisting essentially of gaseous halogen also includes at least one of an inert carrier gas and said β-diketone.

* * * * *